(12) United States Patent
Orlowski et al.

(10) Patent No.: US 7,402,476 B2
(45) Date of Patent: Jul. 22, 2008

(54) METHOD FOR FORMING AN ELECTRONIC DEVICE

(75) Inventors: Marius K. Orlowski, Austin, TX (US);
Brian J. Goolsby, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 414 days.

(21) Appl. No.: 11/152,931

(22) Filed: Jun. 15, 2005

(65) Prior Publication Data

US 2006/0286736 A1 Dec. 21, 2006

(51) Int. Cl.
*H01L 21/8238* (2006.01)
*H01L 21/336* (2006.01)

(52) U.S. Cl. .............. 438/199; 438/300; 257/E21.632; 257/E21.668

(58) Field of Classification Search ................. 438/199, 438/184, 185, 300, 301; 257/E21.632, E21.634, 257/E21.668, E21.669
See application file for complete search history.

(56) References Cited

U.S. PATENT DOCUMENTS

| | | | | |
|---|---|---|---|---|
| 4,963,502 | A * | 10/1990 | Teng et al. | 438/225 |
| 6,074,904 | A * | 6/2000 | Spikes et al. | 438/223 |
| 6,621,131 | B2 | 9/2003 | Murthy et al. | |
| 2003/0111708 | A1 * | 6/2003 | Hwang et al. | 257/514 |
| 2005/0087824 | A1 * | 4/2005 | Cabral et al. | 257/412 |
| 2006/0246641 | A1 * | 11/2006 | Kammler et al. | 438/184 |
| 2006/0286736 | A1 * | 12/2006 | Orlowski et al. | 438/199 |
| 2007/0184600 | A1 * | 8/2007 | Zhang et al. | 438/199 |
| 2007/0264765 | A1 * | 11/2007 | Lan et al. | 438/199 |

OTHER PUBLICATIONS

Thompson et al., "In Search of 'Forever,' Continued Transistor Scaling One New Material at a Time," IEEE Transactions on Semiconductor Manufacturing, vol. 18, No. 1, IEEE, pp. 26-36, Feb. 2005.
Mistry et al., "Delaying Forever: Uniaxial Strained Silicon Transistors in a 90nm CMOS Technology," 2004 Symposium on VLSI Technology Digest of Technical Papers, 2004 IEEE, pp. 50-51.
Ghani et al., "A 90nm High Volume Manufacturing Logic Technology Featuring Novel 45nm Gate Length Strained Silicon CMOS Transistors," 2003 IEEE, pp. 978-980.
Chidambaram et al., "35% Drive Current Improvement from Recessed-SiGe Drain extensions on 37nm Gate Length PMOS," 2004 Symposium on VLSI Technology Digest of Technical Papers, 2004 IEEE, pp. 48-49.

* cited by examiner

*Primary Examiner*—Walter L Lindsay, Jr.

(57) ABSTRACT

An electronic device is formed by forming a first and second layer overlying a plurality of transistor locations. An etch is performed to remove portions of the first and second layers to expose a portion of the plurality of transistor locations, while other portions of the first and second layer remain to protect other transistor locations. Subsequently, source/drain locations of the exposed transistor locations are etched along with the remaining portion of the second layer. The etch is substantially terminated by removing the portion of the second layer using an end-point detection technique involving the first layer. Subsequently an epitaxial layer is formed in the source/drain recesses to provide stress on a channel region of the transistor locations.

20 Claims, 2 Drawing Sheets

METHOD FOR FORMING AN ELECTRONIC DEVICE

BACKGROUND

1. Field of the Disclosure

The present disclosure relates to electronic devices and processes for forming them, and more particularly to electronic devices including epitaxially formed source/drain regions.

2. Description of the Related Art

The etch of source/drain regions can be used to clean source/drain regions or to form recesses within which subsequent epitaxial layer can be formed. The etch process may be used on NMOS and PMOS transistors locations independent of each other. Formation of a protective layer, such as oxide layer, over the transistor locations not being processed allows the processing on exposed transistor locations to proceed. The use of timed etches with the use of protective layers have shown to result in surface loading effects that cause locally increased etch rates that are hard to control and result in recess variations amongst source/drain regions. These recess variations can be tolerable where bulk substrates are used, but can result in bottoming-out where relatively thin active layers are available, such as with silicon-on-insulator substrates. Another problem occurs during removal of the layer used to protect wafer portions not being processed because the exposed transistor locations, which were just etched, are further subjected to the chemistries used to remove the protective layer thereby potentially damaging the exposed transistor locations. A process of providing greater control in the etching of source/drain regions to overcome these problems would be useful.

BRIEF DESCRIPTION OF THE DRAWINGS

The present disclosure may be better understood, and its numerous features and advantages made apparent to those skilled in the art by referencing the accompanying drawings.

It will be appreciated that elements in the figures are illustrated for simplicity and clarity and have not necessarily been drawn to scale. For example, the dimensions of some of the elements in the figures may be exaggerated relative to other elements to help to improve understanding of embodiments.

DESCRIPTION OF THE PREFERRED EMBODIMENT(S)

In accordance with a specific embodiment of the present disclosure, a plurality of protective layers are formed overlying NMOS transistor locations during the formation of SiGe source/drain regions at PMOS transistor locations. At least one of the plurality of protective layers is used to facilitate an end-point-termination technique used to define the depth of a recess at a PMOS transistor source/drain region. Loading effects during the etch used to form the source/drain recesses are reduced by selecting a layer of the protective layers to be etched simultaneously and at substantially the same rate as the source/drain locations. Subsequent to formation of the recess, an epitaxial layer is formed at the source/drain recess locations. This use of an end-point termination technique is an advantage over previous methods of recessing the source/drain regions because it reduces loading affects associated with previous methods and therefore provides greater control and uniformity when creating the source drain recesses.

Figure 1:
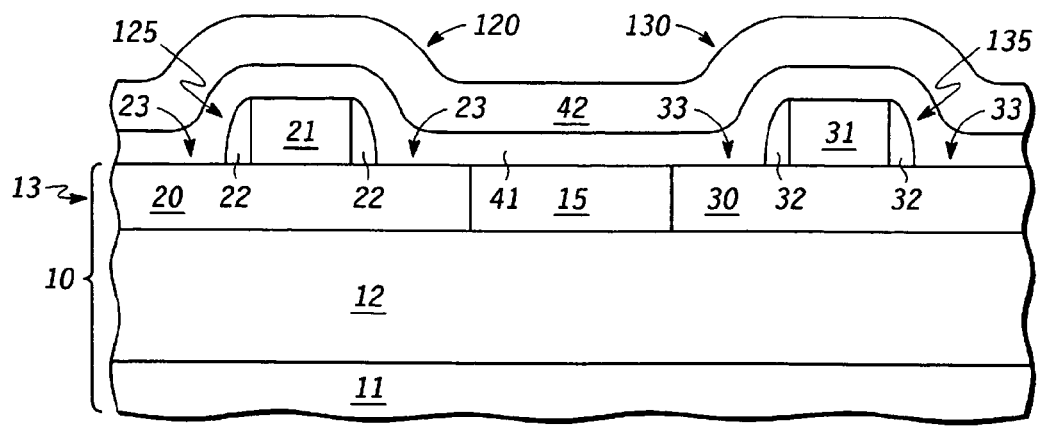
FIG. 1 includes an illustration of a cross-sectional view of a workpiece location that includes gate structures formed overlying a substrate.

FIG. 1 illustrates a cross-sectional view of a location 100 of an electronic device workpiece having plurality of transistor locations including transistor locations 120 and 130. Specific features at location 100 of the workpiece include substrate 10, isolation region 15, gate structures 125 and 135, and layers 41 and 42.

The substrate 10 is an electronic device substrate used for forming electronic devices such as semiconductor devices. In one embodiment, the substrate 10 is a substantially monocrystalline semiconductor material, such as silicon bulk substrate. In the embodiment illustrated at FIG. 1, substrate 10 is a silicon-on-insulator (SOI) substrate that includes a device layer 13, insulating layer 12, and support layer 11. The insulating layer is also referred to as buried oxide layer (BOX).

In original substrate form, the device layer 13 is typically a monocrystalline semiconductor material, which for purposes of discussion herein is presumed to be silicon, having a thickness in the range of approximately 50 to 60 nm, and typically approximately 55 nm. The device layer 13 of the workpiece illustrated in FIG. 1 includes two active regions 20 and 30 that are electrically isolated from each other by isolation feature 15. The insulating layer 12 of substrate 10 is typically formed of an insulating material having a thickness sufficient to substantially prevent parasitic capacitance between the underlying support layer 11 and electronic devices being formed at the device layer 13.

Transistor location 120 includes active region 20 and gate structure 125. Active region 20 includes a channel region underlying the gate structure 125 and source/drain locations 23. Similarly, transistor location 130 includes active region 30 and gate structure 135. Active region 30 includes a channel region underlying the gate structure 135 and source/drain locations 33. Gate structures 125 and 135 include conductive gate structures 21 and 31 respectively, and gate sidewall structure 22 and 32, respectively. Other gate features not specifically illustrated include gate isolation layers that are formed between a transistor's channel region and conductive gate structure. For example, a gate isolation layer separates active region 20 from conductive gate structure 21, and another gate isolation layer separates active region 30 and conductive gate structure 31.

Conductive gate structures 21 and 31 are typically formed using a semiconductor element such as amorphous or monocrystalline silicon. Sidewall structures 22 and 32 typically comprise multiple layers. In the specific embodiment illustrated an outer layer of sidewall structures 22 and 32 are formed with a material that is selectively etchable from the layer 41 to facilitate removal of layer 41 without substantially removing spacers 22 and 32. The material forming the outer layer of spacers 22 and 32 can include a nitride or an oxide.

In accordance with a specific embodiment, transistor location 120 represents one of a plurality of NMOS devices of the workpiece, and transistor location 130 represents one of a plurality of PMOS devices of the workpiece. Note that processing techniques described herein describe the processing of PMOS transistor location 130, though similar techniques can be used to facilitate processing of a NMOS transistor locations, with exceptions noted as needed for clarity.

Layer 41 is a hardmask layer formed overlying the gate structures 125 and 135 to protect NMOS transistors during subsequent processing. In one embodiment, the material of layer 41 is selectively etchable relative to the material of the active layers 20 and 30 and to spacers 32, thereby allowing removal of layer 41 without substantial removal of the active layers 20 and 30, or the spacers 22 and 32. In one embodiment, layer 41 is an oxide, such as silicon dioxide, that can be selectively etched relative to active region 30 when the active region 30 comprises silicon. In other embodiments the layer 41 can be a silicon nitride ($Si_3N_4$) layer or can be formed of several dielectric layers.

Desirable thickness ranges of layer 41 include a thickness of approximately 50 nm or less, a thickness of approximately 40 nm or less, a thickness of approximately 30 nm or less, a thickness of approximately 25 nm or less, a thickness of approximately 20 nm or less. Layer 42 is a hard mask layer formed overlying layer 41. Removal of layer 42 is detectable to facilitate an end-point-detection technique described in greater detail herein. In one embodiment, layer 42 is a material selectively etchable relative to layer 41, so that layer 42 can be removed without substantial removal of layer 41. In another embodiment, layer 42 or layer 41 can include a tracer material used to facilitate the end-point-detection used herein. For example, in one embodiment, layer 42 is a poly or amorphous silicon layer that can be formed using a standard CVD processes, while layer 41 is an oxide layer that can also be formed using standard CVD processes. In this embodiment, since layer 42 is selectively etchable relative to layer 41, end-point-termination techniques, as further described herein can be used. Alternatively, it will be appreciated that layer 42 could comprise multiple layers whereby a tracer layer can be used to facilitate end-point-termination. Possible thicknesses of layer 42 will be discussed in greater detail herein with respect to specific embodiments of the disclosure.

Figure 2:
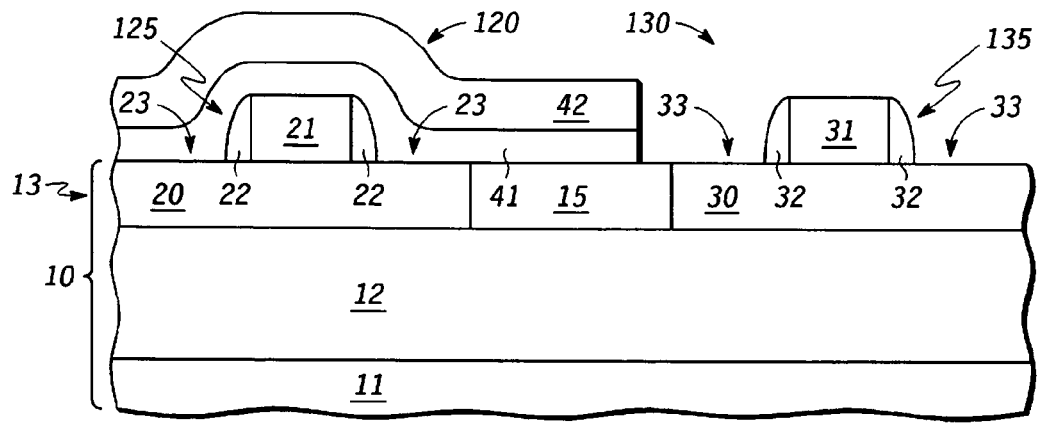
FIG. 2 includes an illustration of a cross-sectional view of the workpiece location of FIG. 1 after formation of openings to expose source/drain substrate locations.

FIG. 2 illustrates portions of layers 41 and 42 removed to form openings that expose active layer 30 material at source/drain locations 33, and leaving portions of layers 41 and 42 overlying transistor location 120. Formation of the openings at source/drain locations 33 is accomplished using conventional etching techniques, which typically include intermediate photo masks subjected to photolithography techniques to facilitate the pattern definitions corresponding to the openings of FIG. 2. In a specific embodiment, when layer 42 is an amorphous or polysilicon layer, an etch comprising HBr and $Cl_2$ can be used. When layer 41 is a silicon oxide hard mask overlying monocrystalline silicon of active region 30, and spacers 32 have a nitrogen containing outer material, such as a $Si_3N_4$, an etch comprising HF can be used, thereby removing layer 41 and leaving the sidewall spacer 32, gate 31, and underlying active Silicon region 30 intact.

Figure 3:
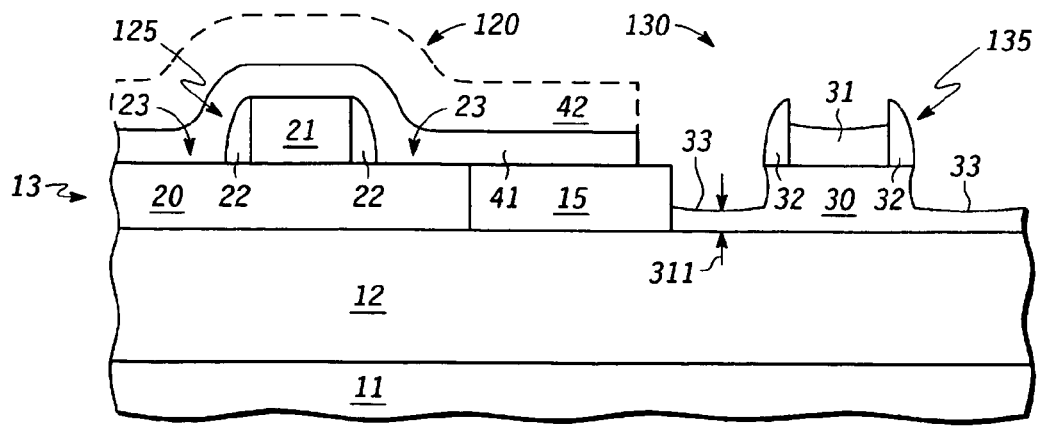
FIG. 3 includes an illustration of a cross-sectional view of the workpiece of FIG. 2 after etching portions of the workpiece.

FIG. 3 illustrates the workpiece at location 100 after conductive gate structure 31 and source/drain locations 33 have been etched to form recesses. Note that transistor location 130 is described herein to be a PMOS transistor location that is but one of a plurality of PMOS transistor locations being etched. In accordance with a specific embodiment, the etch used to form the recesses at source/drain locations 33 is terminated based upon an end-point-detection technique involving layer 42. Specifically, removal of layer 42, indicated by the dashed line in FIG. 3, is monitored to determine its removal. In one embodiment, an optical emissions spectroscopy (OES) technique can be used to determine when an amount of material corresponding to layer 42 is reduced during etch, thereby indicating the etch has reached layer 41. Alternatively, OES can be used to determine the presence of layer 41, which would also indicate removal of layer 42. Once an end-point-detect condition has occurred, a time-based over-etch will typically be performed, which may be based upon a fixed amount of time or an amount of time based upon a percentage of the initial etch prior leading up to the end-point-detect condition.

In one embodiment, it is desirable to leave a portion of active layer 30 at source/drain locations 33 having a thickness 311 to facilitate subsequent epitaxial formation at locations 33. For example, the thickness 311 of locations 33 will typically be less than approximately 30 nm, and preferably less than approximately 25 nm, or approximately 20 nm. End-point-detection techniques are used to terminate the etch of locations 33 to assure sufficient silicon remains to allow subsequent epitaxial formation.

In one embodiment, the etch used to form recesses at active layer 30 also etches layer 42 and provides an etch rate ratio of approximately a 1:1 between layer 42 and active layer 30. For example, when both layer 42 and active region 30 are silicon-based layers, an etch rate ratio of 1:1 can be achieved using conventional silicon etch techniques. For example, an isotropic etch process comprising HBr and $Cl_2$ can be used to simultaneously remove the remaining portions of layer 42 and active region 30 at source/drain locations, while an end-point-detection technique is implemented to allow etching of the exposed source/drain material to be end-point-terminated based upon removal of the layer 42.

In one embodiment, an anisotropic etch used to etch the source/drain regions includes HBr and $Cl_2$ in a molecular ratio of approximately 5:3, with a 475 Watt source power, 20-40 Watt bias power, and a chamber pressure of approximately 4 milliTorr for 6-13 seconds to leave 15-20 nm of Si from a starting thickness of 40-55 nm of Si.

In an alternate embodiment, an isotropic etch can be used to form recesses that undercut under the spacer structures. The isotropic etch can use SF6 and Ar at a ratio of about 1:20, with a 200-500 Watt source power, 0 Watt bias power, and a chamber pressure of approximately 3-4 milliTorr for 7-12 seconds to leave 15-20 nm of Si from a starting thickness of 40-55 nm.

A breakthrough step can be performed prior to the above etches to remove any native SiO2 can be used that uses $CF_4$ and Ar in a molecular ratio of 1:9, with a 300 Watt source power, 20-40 Watt bias power, and a chamber pressure of approximately 4 milliTorr for 5-7 seconds.

In one embodiment, layer 42 has a thickness of 25-35 nm to facilitate an end-point-terminated etch that will remove substantially the same amount of active region 30 at locations 33. This is advantageous over timed etches of previous methods in that the final thickness 311 of locations 33 can be more closely controlled through end-point-termination of the etch. Furthermore, etching layer 42 simultaneously with the material at locations 33 allows for a uniform surface loading across the entire wafer that is near 100 percent. Note, the only surface area of the workpiece not etched during formation of the location 33 recesses is the exposed portion of the isolation regions 15. Allowing for uniform surface loading during the etch process that forms the recesses at locations 33 facilitates a slower, more controllable and uniform etch. For example, the etch time of greater than 10 seconds is desirable over methods that require shorter etch times, which are not as uniform, or otherwise controllable across the workpiece.

Figure 4:
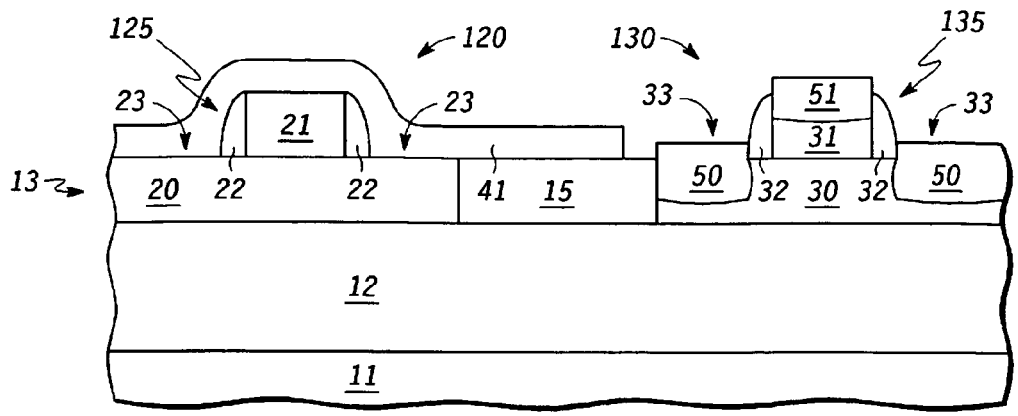
FIG. 4 includes an illustration of a cross-sectional view of the workpiece of FIG. 3 after formation of a layer at exposed portions of the workpiece.

FIG. 4 illustrates the formation of epitaxial layers 50 and 51 having thicknesses of approximately 50-70 nm overlying the exposed source/drain locations 33 and conductive gate 31 respectively. In accordance with the present disclosure, a material of the epitaxial layer is selected to provide compressive stress on the channel region of the transistor location 130. In one embodiment, the compressive characteristic is introduced by forming layer 50 epitaxially to have the same lattice structure as active layer 30 from a material having a larger intrinsic lattice spacing than active layer 30. The intrinsic lattice spacing is defined to be the material's lattice spacing when the material is in it's natural, i.e. relaxed state. For example, epitaxial layer 50 can be formed from a silicon germanium (SiGe) combination, germanium being an additive, to form epitaxial layer 50 providing the compressive stress to the channel region of the transistor location 130. In one embodiment, the approximate atomic ratio of silicon to germanium in epitaxial layers 50 and 51 is 9-1.5:1, with a typical ratio being approximately 3:1. In one embodiment, the layer 50 is formed to have an upper surface that is above an interface of conductive gate 31 and its gate oxide (not shown). Where a 1:1 etch rate exists between layer 30 and layer 42, a thickness of layer 42 will be less than the desired thickness of layer 50 to facilitate the upper surface of the epitaxial layer 50 being formed above the interface between conductive gate 31 and its underlying gate oxide.

Note that similar techniques can be used on NMOS transistors, whereby an epitaxial material providing a tensile stress would be used. In this case the source/drain recesses of the NMOS transistors would be formed as described previously for PMOS transistors. However, the resulting recessed would be filled with Silicon Carbon (SiC) instead of Silicon Germanium (SiGe), because SiC has a smaller intrinsic lattice spacing than the material forming active layer 30. A typical atomic ratio of silicon to carbon in such an epitaxial layer would be 30-100:1. Consequently, SiC source/drain fills would impart a tensile stress on the NMOS channel.

Figure 5:
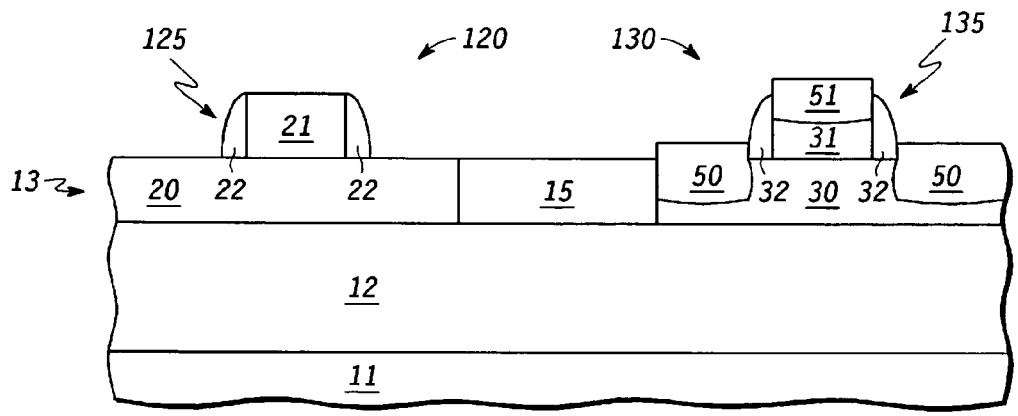
FIG. 5 includes an illustration of a cross-sectional view of the workpiece of FIG. 3 after removal of a layer.

FIG. 5 illustrates removal of layer 41 subsequent to formation of epitaxial layers 50. It will be appreciated that during removal of layer 41 that exposed features at transistor location 130 will be subjected to the chemistries that etch layer 41. Because this exposure can be detrimental to the PMOS transistors being formed at location 130 it is desirable to limit their exposure to the process that removes layer 41. One way to reduce this exposure is to reduce the duration of the process that removes layer 41 by reducing the thickness of layer 41. It is possible to reduce the thickness of layer 41 beyond that of previous methods because the process of the present disclosure protects layer 41 from exposure to processes used to form the recessed source/drain regions that would otherwise damage layer 41. For example, the present disclosure does not expose remaining portions of layer 41 to chemistries used to form openings at FIG. 2, or substantially to chemistries that formed the recesses at locations 33. As a result, it is possible for layer 41 to have a thickness less than the thickness of layer 42, and less than the depth of the recesses illustrated at FIG. 3.

Figure 6:
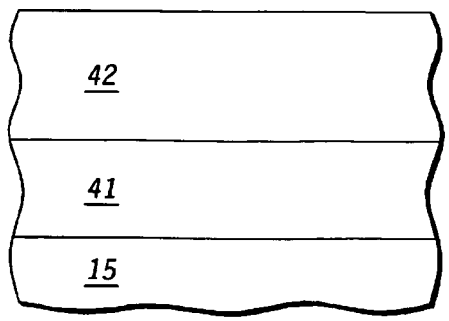
FIGS. 6 and 7 include an illustration of a cross-sectional view of specific embodiments of layers illustrated in FIG. 1.
Figure 7:
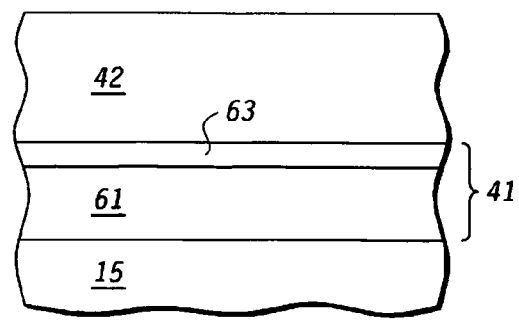

FIG. 6 illustrates a specific embodiment of layers 41 and 42, wherein layer 41 is formed of a single layer. FIG. 7 illustrates a specific embodiment of layers 41 and 42, wherein layer 41 comprises at least two layers 61 and 63, where layer 63 can represent a tracer layer that is detected to terminate the etch process of layer 42. It will be appreciated that the layers of FIGS. 6 and 7 can comprise additional layers as needed to facilitate various manufacturing requirements. In one embodiment, a standard wet etch can be used to remove layer 41.

It will be appreciated that the present disclosure has been provided to enable one of ordinary skill in the art to understand the disclosure. The various details and embodiments of the disclosure will be better understood based upon the terms described below which are defined or clarified.

Group numbers corresponding to columns within the Periodic Table of the elements use the "New Notation" convention as seen in the *CRC Handbook of Chemistry and Physics*, 81$^{st}$ Edition (2000).

The term "semiconductor element" is intended to mean an element by itself or in combination with one or more elements that form a semiconductor. For Group 14 semiconductors, semiconductor elements include Si, Ge, and C, but do not include Group 13 or Group 15 elements. Such Group 13 or Group 15 elements within a Group 14 semiconductor would be dopants that affect the conductivity and other electronic characteristics of the Group 14 semiconductor. For III-V semiconductors, semiconductor elements include Group 13 and Group 15 elements, but do not include Group 14 elements. Similarly, for II-VI semiconductors, semiconductor elements include Group 2, Group 12, and Group 16 elements, but do not include Group 13, Group 14, or Group 15 elements.

The term "substrate" is intended to mean a base material. An example of a substrate includes a quartz plate, a monocrystalline semiconductor wafer, a semiconductor-on-insulator wafer, etc. The reference point for a substrate is the beginning point of a process sequence.

The term "hard mask" is intended to mean mask that is patterned through the use of intermediate layers subjected to photomask and photolithography techniques, such that the hard mask remains after ashing of any photoresist layers or the like.

The term "workpiece" is intended to mean a substrate and, if any, one or more layers one or more structures, or any combination thereof attached to the substrate, at any particular point of a process sequence. Note that the substrate may not significantly change during a process sequence, whereas the workpiece significantly changes during the process sequence. For example, at the beginning of a process sequence, the substrate and workpiece are the same. After a layer is formed over the substrate, the substrate has not changed, but now the workpiece includes the combination of the substrate and the layer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the terms "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, principles of the invention have been described above in connection with specific embodiments. However, one of ordinary skill in the art appreciates that one or more modifications or one or more other changes can be made to any one or more of the embodiments without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

What is claimed is:

1. A process for forming an electronic device comprising:
   forming a first layer overlying a first plurality of transistor locations of a device substrate, wherein each of the first plurality of transistor locations comprises a gate structure and source/drain locations, wherein the gate structure comprises a conductive gate structure and a sidewall structure;
   forming a second layer overlying the first layer;
   etching a first portion of the first layer and the second layer to expose source/drain material comprising a semiconductor element at the source/drain locations of a second plurality of transistor locations and leaving a second portion of the second layer overlying a third plurality of transistor locations, wherein the first plurality of transistor locations comprise the second and third plurality of transistor locations;
   etching the exposed source/drain material and the second portion of the second layer simultaneously, wherein etching of the exposed source/drain material is endpoint-terminated based upon removal of the second layer; and
   forming a third layer at the source/drain locations of the second plurality of transistor locations after etching the exposed source/drain material, wherein the third layer is formed epitaxially to have a same lattice structure and a different intrinsic lattice spacing as the exposed source/drain material.

2. The process of claim 1 wherein the first plurality of transistor locations comprise PMOS transistor locations, the second plurality of transistor locations comprise NMOS transistor locations, and the intrinsic lattice spacing of a material of the third layer is larger than the lattice spacing of the exposed source/drain material.

3. The process of claim 2 wherein the second layer comprises the semiconductor element.

4. The process of claim 3 wherein the third layer comprises the semiconductor element and an additive.

5. The process of claim 4 wherein the semiconductor element comprises silicon.

6. The process of claim 5 wherein the additive comprises germanium.

7. The process of claim 1 wherein the second layer comprises the semiconductor element.

8. The process of claim 7 wherein a thickness of the second layer is greater than a thickness of the first layer.

9. The process of claim 1 wherein a thickness of the first layer is less than approximately 25 nm.

10. The process of claim 1 wherein etching the exposed source/drain material and the second portion of the second layer simultaneously further comprises an etch rate of the exposed source/drain material to be approximately the same as an etch rate of the second layer.

11. The process of claim 10 wherein a thickness of the second layer is greater than a thickness of the first layer.

12. The process of claim 11 wherein a thickness of the first layer is less than approximately 25 nm.

13. The process of claim 1 wherein a thickness of the first layer is less than approximately 25 nm.

14. The process of claim 13 wherein a thickness of the second layer is greater than a thickness of the first layer.

15. The process of claim 1 wherein an upper portion of the third layer above an interface between a gate oxide and the conductive gate structure.

16. The process of claim 15 wherein the third layer comprises the semiconductor element and germanium.

17. The process of claim 1 wherein etching the exposed source/drain material comprises etching to form a recess of approximately 20-40 nm of the exposed source drain material.

18. The process of claim 17 wherein the gate structure of first plurality of transistors are formed overlying a Semiconductor element On Insulator (SOI) substrate, wherein a thickness of the semiconductor element layer of the SOI substrate underlying the gate structures of the first plurality of transistors is approximately 50-60 nm.

19. The process of claim 17 wherein a thickness of the third layer is greater than the recess formed by etching the exposed source/drain material.

20. A process for forming an electronic device comprising:
   forming a first layer overlying a first plurality of transistor locations of a device substrate, wherein each of the first plurality of transistor locations comprises a gate structure comprising a conductive gate structure overlying a semiconductor element on insulator (SOI) substrate, a sidewall structure, and a source/drain location;
   forming a second layer overlying the first layer, wherein a thickness of the second layer is greater than a thickness of the first layer;
   etching a first portion of the first layer and the second layer to expose source/drain material comprising a semiconductor element at the source/drain locations of a second plurality of transistor locations and leaving a second portion of the second layer overlying a third plurality of transistor locations, wherein the first plurality of transistor locations comprise the second and third plurality of transistor locations;

etching the exposed source/drain material and the second portion of the second layer simultaneously, wherein etching of the exposed source/drain material is end-point-terminated based upon removal of a substantial portion of the second portion of second layer; and forming a third layer at the source/drain locations of the second plurality of transistor locations after etching the exposed source/drain material, wherein the third layer is formed epitaxially to have a same lattice structure and a different intrinsic lattice spacing as the exposed source/drain material to provide a compressive stress at a channel location of the second plurality of transistor locations.

* * * * *